US012176863B2

(12) United States Patent
Savary et al.

(10) Patent No.: US 12,176,863 B2
(45) Date of Patent: Dec. 24, 2024

(54) AMPLIFIER CIRCUIT WITH TEMPERATURE COMPENSATION

(71) Applicant: NXP USA, INC., Austin, TX (US)

(72) Inventors: Pierre Pascal Savary, Muret (FR); Stephane Damien Thuriés, Saubens (FR)

(73) Assignee: NXP USA, Inc., Austin, TX (US)

(*) Notice: Subject to any disclaimer, the term of this patent is extended or adjusted under 35 U.S.C. 154(b) by 738 days.

(21) Appl. No.: 17/349,081

(22) Filed: Jun. 16, 2021

(65) Prior Publication Data

US 2021/0408971 A1 Dec. 30, 2021

(30) Foreign Application Priority Data

Jun. 26, 2020 (EP) ..................................... 20305716

(51) Int. Cl.
*H03F 1/30* (2006.01)
*G01S 7/03* (2006.01)
(Continued)

(52) U.S. Cl.
CPC .................. *H03F 1/30* (2013.01); *G01S 7/03* (2013.01); *G01S 7/40* (2013.01); *H03F 3/19* (2013.01);
(Continued)

(58) Field of Classification Search
CPC ........ H03F 1/30; H03F 3/19; H03F 2200/447; H03F 2200/451; G01S 7/03; G01S 7/40
(Continued)

(56) References Cited

U.S. PATENT DOCUMENTS 6,714,081 B1 3/2004 Xu
6,887,339 B1 * 5/2005 Goodman ......... H01J 37/32082
156/345.47
(Continued)

FOREIGN PATENT DOCUMENTS

CN 102075148 A 5/2011
EP 1480332 A2 11/2004
(Continued)

OTHER PUBLICATIONS

Shuzheng Mu and Pak Kwong Chan, "Design of Precision-Aware Subthreshold-Based MOSFET Voltage Reference", www.mdpi.com/journal/sensors, Sensors 2022, 22, 9466. https://doi.org/10.3390/s22239466 (Year: 2022).*

(Continued)

*Primary Examiner* — Hafizur Rahman (57) ABSTRACT

There is disclosed an amplifier circuit comprising: an amplifier having input and output terminals; a temperature dependent variable impedance unit comprising: a first terminal, a second terminal and a variable impedance unit control terminal; a transistor comprising a transistor control terminal coupled to the variable impedance unit control terminal; a first resistor coupled in parallel with the conduction channel; a capacitor coupled in series with the conduction channel between the conduction channel and one of: the first terminal; and the second terminal; and wherein: the first terminal is coupled to one of: the input terminal and the output terminal; the second terminal is for coupling to a reference node; and the variable impedance unit control terminal is configured to receive a control signal that is based on a measured temperature indicative of a temperature of the amplifier circuit and thereby provide a temperature dependent variable impedance for the amplifier circuit.

20 Claims, 4 Drawing Sheets (51) Int. Cl.
  *G01S 7/40* (2006.01)
  *H03F 3/19* (2006.01)
(52) U.S. Cl.
  CPC .. *H03F 2200/447* (2013.01); *H03F 2200/451* (2013.01)
(58) Field of Classification Search
  USPC .......................................................... 330/256
  See application file for complete search history.

(56) References Cited

U.S. PATENT DOCUMENTS

| | | | |
|---|---|---|---|
| 7,138,836 B2 | 11/2006 | Ajit et al. | |
| 8,279,008 B2 | 10/2012 | Hsieh et al. | |
| 8,653,892 B2* | 2/2014 | Wang | H04B 1/1036 |
| | | | 330/261 |
| 8,729,962 B2 | 5/2014 | Lin et al. | |
| 9,419,565 B2 | 8/2016 | Nobbe et al. | |
| 9,623,237 B2* | 4/2017 | Turner | H03M 11/24 |
| 9,755,581 B2* | 9/2017 | Khasnis | H03F 3/21 |
| 9,912,300 B2* | 3/2018 | Harasawa | G05F 3/20 |
| 11,177,777 B2* | 11/2021 | Yamashiro | G01K 7/015 |
| 2003/0112078 A1 | 6/2003 | Rategh et al. | |
| 2005/0208909 A1* | 9/2005 | Maya | H03F 1/0222 |
| | | | 455/127.1 |
| 2010/0060357 A1* | 3/2010 | Drogi | H03F 3/24 |
| | | | 330/192 |
| 2013/0033327 A1* | 2/2013 | Kadoi | H03F 1/0211 |
| | | | 330/285 |
| 2014/0253242 A1 | 9/2014 | Youssef et al. | |
| 2016/0344350 A1* | 11/2016 | Khasnis | H03F 1/30 |
| 2018/0034426 A1 | 2/2018 | Tabei et al. | |
| 2018/0152151 A1* | 5/2018 | Harasawa | H03F 1/30 |
| 2018/0198429 A1* | 7/2018 | Tabei | H03F 1/301 |

FOREIGN PATENT DOCUMENTS

| | | | |
|---|---|---|---|
| GB | 2123231 A | | 1/1984 |
| JP | 2014192805 A | * | 10/2014 |

OTHER PUBLICATIONS

Super beta fully differential amplifiers launch new era of precision, https://www.electronicdesign.com/technologies/analog/article/21156842/texas-instruments (Year: 2024).*

U.S. Appl. No. 17/349,096 and Preliminary Amendment filed Jun. 16, 2021 and entitled "Amplifier Circuit With an Output Limiter".

Non-final office action dated Nov. 9, 2023 in U.S. Appl. No. 17/349,096.

Notice of Allowance dated Mar. 5, 2024 in U.S. Appl. No. 17/349,096.

* cited by examiner

AMPLIFIER CIRCUIT WITH TEMPERATURE COMPENSATION

CROSS-REFERENCE TO RELATED APPLICATIONS

This application claims the priority under 35 U.S.C. § 119 of European Patent application no. 20305716.1, filed on 26 Jun. 2020, the contents of which are incorporated by reference herein.

FIELD

The present disclosure relates to an amplifier circuit and, in particular, to an amplifier circuit including a temperature dependent variable impedance unit configured to receive a control signal based on a measured temperature. It also relates to an automotive radar transceiver including such an amplifier circuit.

SUMMARY

According to a first aspect of the present disclosure there is provided an amplifier circuit comprising: an amplifier having an amplifier input terminal and an amplifier output terminal; a temperature dependent variable impedance unit comprising: a first terminal, a second terminal and a variable impedance unit control terminal; a transistor comprising a conduction channel and a transistor control terminal, wherein the transistor control terminal is coupled to the variable impedance unit control terminal a first resistor, wherein the first resistor is coupled in parallel with the conduction channel of the transistor; a capacitor coupled in series with the conduction channel of the transistor between the conduction channel and one of: (i) the first terminal; and (ii) the second terminal; and wherein: the first terminal is coupled to one of: (a) the amplifier input terminal and (b) the amplifier output terminal; the second terminal is for coupling to a reference node; and the variable impedance unit control terminal is configured to receive a control signal that is based on a measured temperature indicative of a temperature of the amplifier circuit and thereby provide a temperature dependent variable impedance for the amplifier circuit.

In one or more embodiments, the amplifier circuit may further comprise a control signal supply unit, wherein the control signal supply unit is configured to: measure the temperature indicative of a current temperature of the amplifier circuit; and provide the control signal based on the measured temperature to the variable impedance unit control terminal.

In one or more embodiments, the control signal supply unit may comprise a temperature-controlled voltage source.

In one or more embodiments, the control signal supply unit may comprise a temperature sensor configured to measure the temperature by being configured to determine one of: i) the temperature of the amplifier circuit; ii) the temperature of an integrated circuit substrate on which the amplifier circuit is formed; and iii) the temperature of a structure, wherein the structure is responsive to ambient temperature at a rate within a threshold of the rate at which the amplifier circuit is responsive to ambient temperature.

In one or more embodiments, the control signal supply unit may include registers for storing values to calibrate the control signal supply unit to provide fine-tuning of the temperature dependence based on one or more temperature measurements.

In one or more embodiments, the control signal may be linearly dependent on the measured temperature.

In one or more embodiments, the control signal may be non-linearly dependent on the measured temperature.

In one or more embodiments, the control terminal may be configured to receive the control signal from a control signal supply unit that is arranged remote from the amplifier circuit but configured to be responsive to ambient temperature at a rate within a threshold of the rate at which the amplifier circuit is responsive to ambient temperature.

In one or more embodiments, the amplifier circuit may further comprise a second resistor, wherein the control terminal of the transistor is coupled to the variable impedance unit control terminal via the second resistor, and wherein the second resistor may be configured to reduce the impact of parasitic capacitances from the control signal supply unit on the gate of the transistor In one or more embodiments, when the temperature compensation arrangement is coupled to the amplifier output terminal, the capacitor may be coupled between the first terminal and the conduction channel of the transistor.

In one or more embodiments, the transistor may comprise a MOSFET.

In one or more embodiments, the amplifier may comprise a differential cascode amplifier wherein the differential cascode amplifier comprises: a first branch having a first end couplable to a first cascode reference node and a second end couplable to both a second cascade reference node, via an output matching network capacitor, and a cascode voltage source, the first branch further comprising: a first cascode transistor having a conduction channel and a control terminal, the conduction channel of the first cascode transistor couplable at a first terminal to the first cascode reference node; a second cascode transistor having a conduction channel and a control terminal, the conduction channel of the second cascode transistor coupled at a first terminal in series with a second terminal of the conduction channel of the first cascode transistor; and a first output matching network portion, the first output matching network portion coupled at a first terminal to a second terminal of the conduction channel of the second cascode transistor and a second terminal of the first output matching network portion couplable to the second reference node; a second branch having a first end couplable to the first cascode reference node and a second end couplable to the second cascode reference node, the second branch further comprising: a third cascode transistor having a conduction channel and a control terminal, the conduction channel of the third cascade transistor couplable at a first terminal in series with the first cascode reference node; a fourth cascode transistor having a conduction channel and a control terminal, the conduction channel of the fourth cascode transistor coupled at a first terminal in series with a second terminal of the conduction channel of the third cascode transistor; and a second output matching network portion, the second output matching network portion coupled at a first terminal to a second terminal of the conduction channel of the fourth cascode transistor and a second terminal of the second output matching network portion couplable to the second reference node, wherein the control terminals of the second and fourth cascode transistors are coupled together, wherein the control terminals of the first cascode transistor and the control terminal of the third cascode transistor is coupled to the amplifier input terminal, and wherein one of the first and second output matching network portions is coupled to the amplifier output terminal.

In one or more embodiments, the first terminal of the temperature dependent variable impedance unit may be coupled to an input matching network comprising: an input matching network capacitor couplable at a first terminal to the voltage source; an input matching network reference node couplable to a second terminal of the input matching network capacitor; and an input matching network inductance element coupled at a first terminal to the first terminal of the input matching network capacitor and a second terminal of the input matching network inductance element coupled to the amplifier input terminal.

In one or more embodiments, the inductance element may comprise an inductor, a transmission line or a combination thereof.

According to a second aspect of the present disclosure, there is provided an automotive radar transceiver comprising the amplifier circuit of the first aspect.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

The gain of amplifier devices can vary significantly with temperature, leading to large changes in the way an input signal is amplified along a signal path of the amplifier and thereby causing suboptimal level control or even degradation of the circuit due to hot carrier injection (HCI) if the signal amplitude becomes too high.

In some applications, such as millimetre wave CMOS transceivers used in automotive radar devices, several amplifiers may be used in each of a transmit path and a receive path of the transceiver. Amplifiers in such systems may experience gains of 20 dB to 40 dB over a temperature change from −40 Celsius to +125 Celsius. In such cases, an accurate level control may be particularly difficult to implement.

The amplifier circuit according to the present disclosure provides for control of the amplifier gain variation over temperature using a variable impedance in parallel with an input or output of an amplifier circuit, that acts as a signal attenuator, wherein the variable impedance is controlled by a control signal based on a measured temperature indicative of a temperature of the amplifier circuit.

Figure 1:
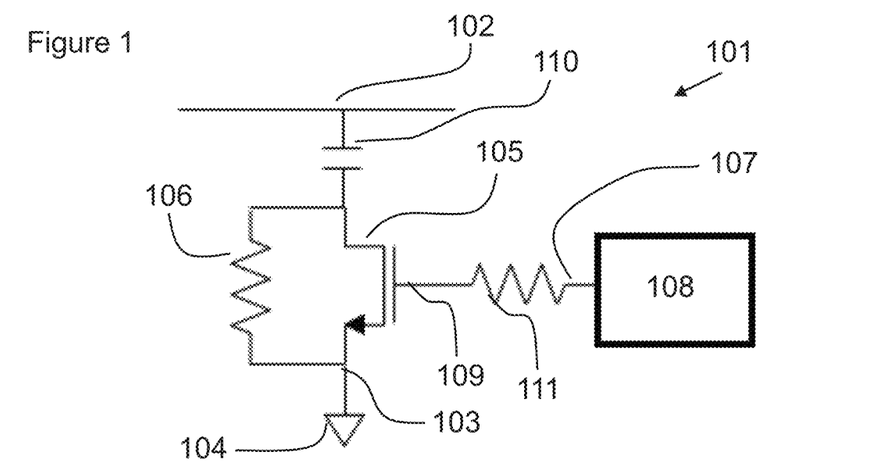
FIG. 1 shows an example embodiment of a temperature dependent impedance unit.

FIG. 1 shows a temperature dependent variable impedance unit 101 according to the present disclosure. The temperature dependent variable impedance unit 101 comprises a first terminal 102 coupled to either an amplifier input terminal or an amplifier output terminal of an amplifier, where the amplifier and the temperature dependent variable impedance unit 101 together provide an amplifier circuit (shown in FIGS. 2 and 3). It has been found that similar or equal control of the temperature dependence may be provided with the temperature dependent variable impedance unit 101 coupled to the amplifier input terminal of the amplifier or to the amplifier output terminal.

Any amplifier having a temperature dependence may benefit from the temperature dependent variable impedance unit 101 of the present disclosure. In some embodiments, an amplifier configured to be used in receipt or detection of millimetre wave signals may particularly benefit from the temperature dependent variable impedance unit 101. In one or more embodiments, an amplifier comprising a differential cascade amplifier may benefit from the temperature variable impedance unit 101, as described in more detail with reference to FIG. 2 where separate temperature dependent variable impedance units are coupled to either both of the amplifier input terminals or to both of the amplifier output terminals.

The temperature dependent variable impedance unit 101 comprises a second terminal 103, wherein the second terminal 103 is configured to be coupled to a reference node 104. The reference node 104 may be a node which is set to a reference voltage, such as a ground node set to a relative 0 V. It will be appreciated, however, that the reference node 104 may be set to any suitable reference voltage.

Any reference node referred to herein may comprise a ground node set to a relative 0 volts and any reference node may be set to a same relative voltage of one or more of the other reference nodes, or one or more reference nodes may be set to different reference voltages, as is appropriate to enable operation of the amplifier circuit in the described manner. It will further be appreciated that, typically, reference nodes, such as a ground node, are only considered coupled to ground when coupled to a power source. As such, references to terminals being couplable to ground are understood by the skilled person as being a clear reference that such an amplifier circuit does not need to be coupled to a power source to be an amplifier circuit according to the present disclosure but is configured to be so coupled in use.

The temperature dependent variable impedance unit 101 also comprises a transistor 105 comprising a conduction channel and a control terminal. The transistor 105 may be any suitable transistor such as, by way of non-limiting example, a metal-oxide-semiconductor field-effect transistor (MOSFET) or a bipolar junction transistor (BJT). In some embodiments, because of MOSFET does not need a gate current, the use of a MOSFET may provide for a less complex circuit design. It will be appreciated that, while different types of transistors use different nomenclature for their various terminals, and some transistors have additional terminals, a common feature of transistors is the presence of a conduction channel which can act as a switch or variable resistor controlled by a voltage applied at a control terminal. In some examples the control terminal may comprise a base or a gate, In some examples, the terminals of the conduction channel may comprise a collector and an emitter or a source and a drain.

The temperature dependent variable impedance unit 101 may comprise a first resistor 106 connected in parallel with the conduction channel of the transistor 105. The first resistor 106 may be a discrete resistor component. The first resistor 106 in combination with the transistor 105 provide a variable impedance which is controlled by the voltage received at the control terminal 109 of the transistor 105. To first order, the variable impedance provided by the first resistor 106 and the transistor 105 may be approximated as a variable resistor. In particular, the first resistor 106 may be configured to keep the voltage across the conduction channel ($V_{DS}$) of the transistor 105 substantially equal to zero.

The temperature dependent variable impedance unit 101 further comprises a variable impedance unit control terminal 107 coupled to the transistor control terminal 109. The variable impedance unit control terminal is configured to receive a control signal that is based on a measured temperature indicative of temperature of the amplifier circuit. By providing a signal at the transistor control terminal 109 that is dependent on a measured temperature indicative of the temperature of the amplifier circuit, the variable impedance provided by the combination of the first resistor 106 and the transistor 105 is made temperature dependent. In this way, the variable impedance unit attenuates the input or output signal level in such a way as to counteract the temperature dependence of the amplifier. This approach removes a dependence on input power level in the case the temperature compensation is made by the biasing circuit of the amplifier by acting as an attenuation to the input signal or output signal. Further, the temperature dependent variable impedance unit may provide for improved reliability of the temperature variation compensation provided by the temperature dependent variable impedance unit 101 to the amplifier via the amplifier input terminal as opposed to providing for compensation of a bias control signal.

In some embodiments, the measured temperature may be a direct measure of the temperature of the amplifier circuit. This may be obtained by a temperature sensor in close proximity with, or in direct contact with the amplifier circuit, such as in contact with the amplifier or packaging thereof. This may be beneficial, as a temperature measurement obtained by such a direct measurement may provide a particularly accurate measurement of the temperature, and thereby the corresponding control signal, which has little or no time delay with respect to temperature changes of the amplifier circuit.

The measured temperature may also be obtained by measuring a temperature of an integrated circuit substrate on which the amplifier circuit is formed. In some embodiments, this may provide for a temperature measurement which can be obtained from a pre-existing temperature sensor in the integrated circuit, or an additional temperature sensor. A measurement of the integrated circuit may be particularly representative of the temperature of the amplifier circuit.

In yet other embodiments, the measured temperature may be a temperature of a structure, wherein the structure is responsive to ambient temperature at a rate within a threshold of the rate at which the amplifier circuit is responsive to ambient temperature; and wherein a temperature sensor is configured to provide the temperature signal. In some embodiments, the structure may be part of the amplifier circuit or it may be remote from the amplifier circuit. Thus, an adjacent integrated circuit or PCB may be configured to be responsive to temperature at a rate similar to that of the amplifier circuit. Accordingly, if the structure and the amplifier circuit are exposed to the same ambient temperature, it can be expected that the temperature of the structure represents the temperature of the amplifier circuit.

It will be appreciated that the measured temperature does not need to be a measurement of the temperature of the amplifier as long as the measured temperature is indicative of a temperature of the amplifier. For example, in a system comprising a plurality of amplifiers, each of those amplifiers may vary in temperature at similar rates. Further, each amplifier may include a temperature dependent variable impedance unit 101. As such, the temperature of each individual amplifier may not need to be measured and, instead, the temperature of an integrated circuit may be measured and a corresponding control signal may be provided to the control terminals of the transistor 105 of the temperature dependent variable impedance unit 101 coupled to each of the other amplifiers. In this way, while some measurements would not be a measurement of the temperature of the corresponding amplifier, the measured temperature may still be a measured temperature indicative of a temperature of the amplifier circuit. Similarly, the temperature measurement may be a measure of the temperature of a non-amplifier component, as long as that component has a similar heat capacity to the heat capacity of the amplifier of the amplifier circuit, i.e., as long as the remote measured structure varies in temperature at a similar rate to the amplifier. For example, the heat capacity of a remote structure that is having its temperature measured for generation of the control signal may be within 5% or 10% of the heat capacity of the amplifier. Because the measured temperature may be a measure of the temperature of the, or a part of the, amplifier circuit or a remote structure, it will be appreciated that the temperature sensor may be a part of the amplifier circuit or may be remote from the amplifier circuit.

In some embodiments, as shown in FIG. 1, the temperature dependent variable impedance unit 101 may comprise a control signal supply unit 108 wherein the control signal supply unit 108 is configured to measure a temperature and provide the control signal based on the measured temperature to the variable impedance unit control terminal 107. Thus, the unit which performs the measurement of the temperature and generates the control signal may either form part of the amplifier circuit or may be remote from the amplifier circuit. Similarly, based on the previously described ways of obtaining a measured temperature, a sensor which performs the measurement of the temperature may be included in the control signal supply unit 108 or it may be remote from the control signal supply unit 108. having the sensor which performs the temperature measurement form part of the control signal supply unit 108 may, where the control signal supply unit is part of the amplifier circuit, may be particularly beneficial, as it may provide for accurate measurement of the temperature of the amplifier circuit. In some examples, the measured temperature may be measured by a sensor having a thermally dependent property, such as a thermistor or a temperature-controlled voltage or current source. In particular, a thermistor may be used when sensor is remote from the integrated circuit and a temperature-controlled voltage or current source may be used when sensor forms a part of the integrated circuit.

The control signal may be generated automatically by way of a temperature-controlled voltage source which provides an output signal directly based on a measurement of temperature. The control signal may be generated by performing an operation based on the output of the temperature sensor. The operation which generates the control signal may be the processing of an equation, for example, where a property of the temperature signal is one of the inputs to the equation and the output of the equation is the control signal. The equation may be performed by any suitable electronic means such as an analog system associated with a logic gate system or a microprocessor. For example, where a linear control voltage is desired, the equation may be:

$$V_{control}=aT+b$$

where $V_{control}$ is the desired control voltage, T is the measured temperature and a and b are programmable constants that can be tuned. The linear curve, $V_{control}$ may be generated in analog. In other examples, a look-up table may be used where values corresponding to possible control signals are stored in a plurality of programmable registers and the value selected from the plurality of programmable registers is based on the temperature signal. By providing a programmable system like this, measurement of the temperature dependence of the amplifier circuit may be performed, such as after manufacture of the amplifier. Subsequent programming of the registers may be performed based on the measurement of the temperature dependence of the amplifier in order to calibrate the response of the registers. This may provide accurate and bespoke temperature control for each amplifier circuit manufactured.

In some embodiments, the control signal generated by the control signal supply unit 108 may be linearly dependent on the measured temperature. This may provide for a particularly reliable and simple implementation of temperature compensation for the amplifier. In other embodiments, the control signal generated by the control signal supply unit 108 may be non-linearly dependent on the measured temperature. It will be appreciated that non-linear control may be more complex than linear control and may use one or more equations of second order or higher in order to provide for the control signal. In these examples, a more accurate control signal may be provided which provides for improved compensation of temperature variation induced amplifier gain at the expensive of the simplicity of a linear relationship.

The temperature dependent variable impedance unit 101 further comprises a capacitor 110 connected in series with the conduction channel of the transistor 105 between the conduction channel and one of the first terminal 102 and the second terminal 103 of the temperature dependent variable impedance unit 101. The capacitor 110 may be configured to provide for blocking DC components of signals from the amplifier input terminal or the amplifier output terminal. It will be appreciated that the voltages used for the control signal may be different depending on whether the capacitor of the temperature dependent variable impedance unit is coupled between the amplifier input or output terminal and the conduction channel or between the conduction channel and the reference node.

The temperature dependent variable impedance unit 101 may further comprise a second resistor 111, wherein the control terminal of the transistor 105 is coupled to the variable impedance unit control terminal 107 via the second resistor 111. That is, the second resistor 111 may comprise a first terminal coupled to the transistor control terminal 109. The second resistor 111 may further comprise a second terminal coupled to the variable impedance unit control terminal 107 which is configured to receive the control signal. The second resistor 111 may be configured to reduce or mask the impact of parasitic capacitances from the control signal supply unit on the transistor control terminal 105. Reduced impact of parasitic capacitances may be provided as a result of the second resistor 111 having a high impedance relative to the parasitic capacitance of the control signal unit. For example, the impedance of the second resistor may be 2, 5, 10, 50 or 100 times greater than the parasitic capacitance of the control signal unit. It will be appreciated that if the resistance of the second resistor 111 is too high, then the parasitic capacitance of the resistor 111 will negatively impact the circuit. As such, the skilled person appreciates how to choose a suitable resistance to obtain a balance between masking the impact of the parasitic capacitances of the variable impedance control unit while not generating excessive parasitic capacitance of its own.

Figure 2:
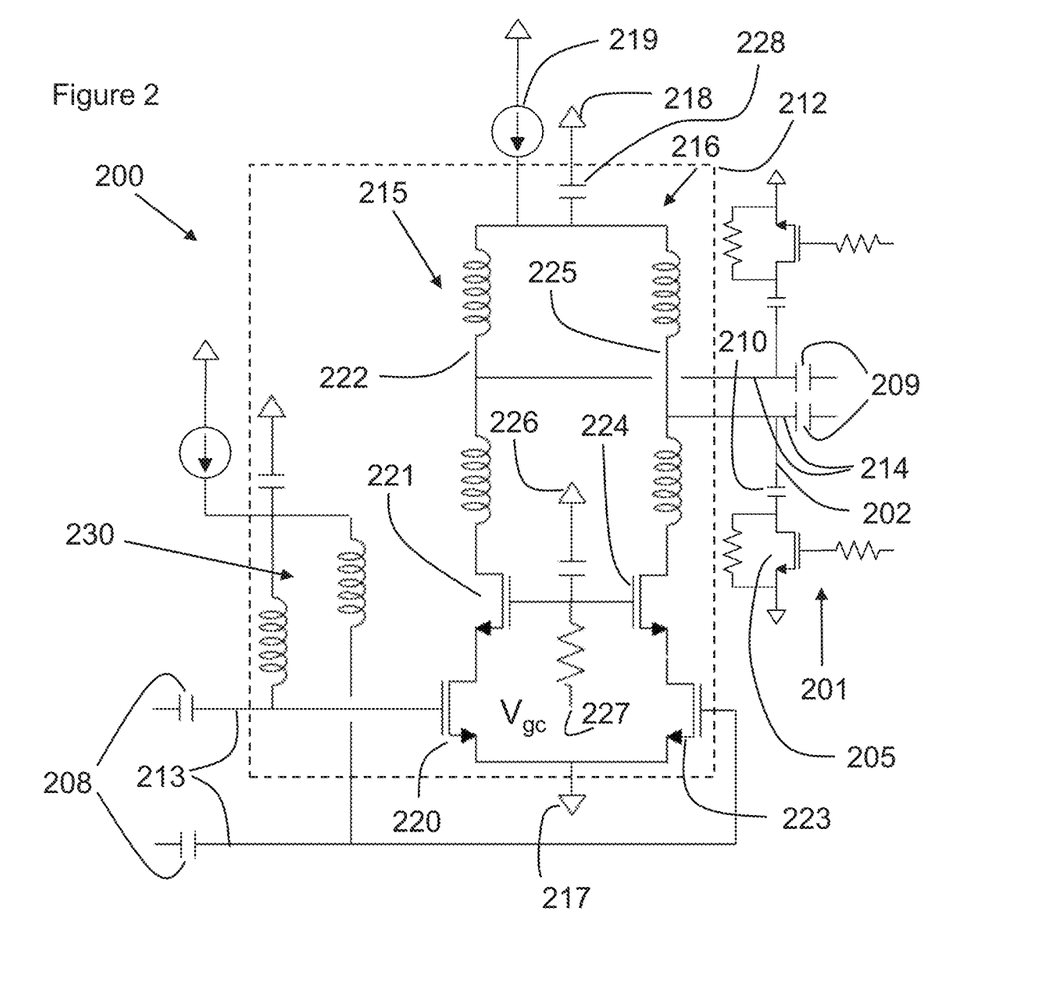
FIG. 2 shows an example embodiment of an amplifier circuit according to the present disclosure having a temperature dependent impedance unit connected to an amplifier output terminal.

FIG. 2 shows an example amplifier circuit 200 comprising an amplifier 212 having an amplifier input terminal 213 and an amplifier output terminal 214. In the example of FIG. 2, the amplifier 200 comprises two amplifier input terminals 213 and two amplifier output terminals 214, but in other amplifiers, only one amplifier input terminal 213 and one amplifier output terminal 214 may be provided. The or each amplifier input terminal 213 may comprise a corresponding input capacitor 208 connected in series with the amplifier input terminal 213. Similarly, the or each amplifier output terminal 214 may comprise a corresponding output capacitor 209 connected in series with the amplifier output terminal 214. The amplifier also comprises two temperature dependent variable impedance units 201 in this example where one is coupled to each of the amplifier output terminals 214. The temperature dependent variable impedance unit 201 may be coupled to the amplifier output terminals 214 either before or after the output capacitor 209. In embodiments where the temperature dependent variable impedance unit 201 is coupled to an amplifier output terminal 214, the capacitor 210 of the temperature dependent variable impedance unit 201 may be coupled between the first terminal 202 of the temperature dependent variable impedance unit 201 and the conduction channel of the transistor 205. The capacitor 210 may be provided in this configuration when the temperature dependent variable impedance unit 201 is coupled to an amplifier output to block the DC component of the supply voltage of the amplifier. In other embodiments, the temperature dependent variable impedance unit 201 may be coupled to the or each amplifier input terminals 213 either before or after the input capacitors 208.

In the example of FIG. 2, the amplifier 212 comprises a differential cascode amplifier. The differential cascode comprises a first branch 215 and a second branch 216, each of the first branch 215 and second branch 216 having a first end and a second end. The first ends of the first branch 215 and the second branch 216 are connectable to a first cascode reference node 217 and the second ends of the first branch 215 and the second branch 216 are connectable to both a second cascode reference node 218, through an output matching network capacitor 228, and a cascode voltage source 219. The first and second cascode reference nodes 217, 218 may be set to a relative voltage of zero or may have another reference voltage value.

The first branch 215 of the differential cascode amplifier 200 may comprise a first cascade transistor 220 having a conduction channel and a control terminal where the conduction channel of the first cascode transistor 220 is couplable at a first terminal in series with the first cascode reference node 217, that is, with the first end of the first branch 215. The control terminal of the first cascode transistor may be coupled to an input terminal 213 of the amplifier 212. The first branch 215 may further comprise a second cascode transistor 221 having a conduction channel and a control terminal, wherein the conduction channel of the second cascode transistor 221 is coupled at a first terminal in series with a second terminal of the conduction channel of the first cascode transistor 220.

The first branch 215 may further comprise a first output matching network portion 222, the first output matching network portion 222 coupled at a first terminal to a second terminal of the conduction channel of the second cascode transistor 221 and a second terminal of the first output matching network portion 222 couplable to the second reference node 218 through the output matching network capacitor 228

The second branch 216 of the differential cascode amplifier 200 may comprise a third cascode transistor 223 having a conduction channel and a control terminal where the conduction channel of the third cascode transistor 223 is couplable at a first terminal in series with the first cascode reference node 217, that is, with the first end of the second branch 216. The control terminal of the third cascode transistor 223 may be coupled to an input terminal 213. The second branch 216 may further comprise a fourth cascode transistor 224 having a conduction channel and a control terminal, wherein the conduction channel of the fourth cascade transistor 224 is coupled at a first terminal in series with a second terminal of the conduction channel of the third cascode transistor 223. The second branch 216 may further comprise a second output matching network portion 225, the second output matching network portion 225 coupled at a first terminal to a second terminal of the conduction channel of the fourth cascode transistor 224 and a second terminal of the second output matching network portion 225 couplable to the second reference node 218 through the output matching network capacitor 228.

In the differential cascode amplifier 200 embodiment of FIG. 2, the control terminals of the second and fourth cascode transistors 221, 224 may be coupled together. The control terminals of the second and fourth cascode transistors 221, 224 may also be couplable to a common third cascode reference node 226 and a common cascade gate voltage source 227.

The first and second output matching network portions 222, 225 may together provide for an output matching network. One of the first and second output matching network portions 222, 225 may be coupled to the amplifier output terminal 214. As previously described, in some embodiments, such as in the differential cascode amplifier 200, the amplifier may comprise two amplifier output terminals and each of the first and second output matching network portions 222, 225 are coupled to a respective one of the amplifier output terminals 214. The first and second output matching network portions 222, 225 may each comprise first and second inductors arranged in series and where a first amplifier output terminal 214 is connected between the first and second inductors of the first branch 215 and a second amplifier output terminal 214 is connected between the first and second inductors of the second branch 216. In other embodiments, the inductors may be replaced with one or more transmission lines or the output matching network portions may comprise a combination of inductors and transmission lines. In other examples, the first and second output matching network portions may have different arrangements. An input matching network 230, which forms part of the amplifier 212, and related features are described in more detail with reference to FIG. 3.

Figure 3:
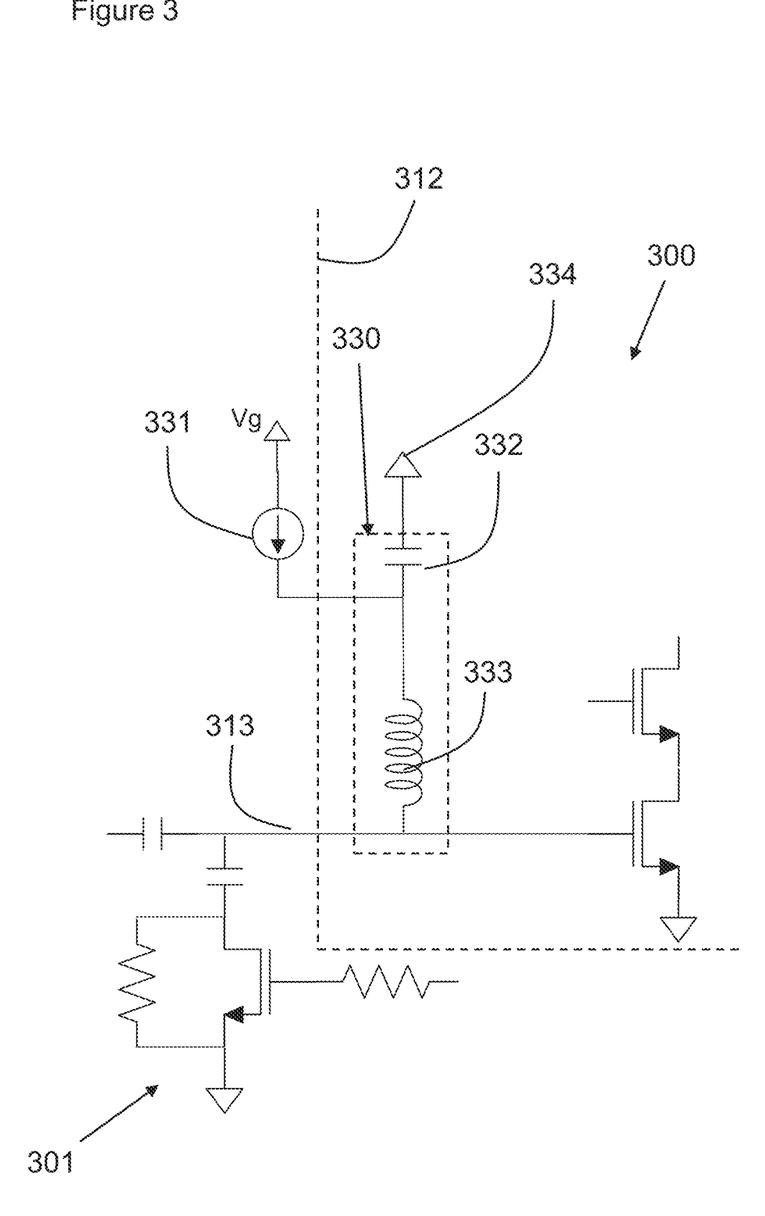
FIG. 3 shows an example embodiment of a portion of an amplifier circuit according to the present disclosure having a temperature dependent impedance unit connected to an amplifier input terminal.

FIG. 3 shows a portion of an example amplifier circuit 300 comprising a portion of an amplifier 312, the temperature dependent variable impedance unit 301, an input matching network 330 and a voltage source 331 coupled to the first input terminal 313 of the amplifier 312, where the input matching network 330 forms a portion of the amplifier 312. The voltage source 331 may be configured to provide a constant voltage. In one or more embodiments, the voltage source may be a voltage source which is variable over temperature.

The input matching network 330 may further comprise an input matching network capacitor 332 coupled at a first terminal to the voltage source 331. The input matching network capacitor 332 may be couplable at a second node of the bias structure capacitor 332 to a input matching network reference node 334. The first terminal of the input matching network capacitor 332 may be coupled to the first terminal of an input matching network inductor 333 where a second node of the input matching network inductor 333 is coupled to the amplifier input terminal 313. The input matching network capacitor 332 and an input matching network inductor 333 may together be part of a matching network for the input signal. The input matching network 330 may be configured to provide a voltage, $V_g$, from the voltage source 331 that is provided to the cascode gate through the input matching network inductor 333.

It will be appreciated that the voltage provided by the voltage source 331 may be different to that provided at the common cascode gate voltage source, $V_{gc}$. Further, the input matching network capacitor 332 and the input matching network inductor 333 isolate the amplifier input terminal from the voltage source 331 and matches the input of the amplifier, so that it is part of the input matching network.

In some embodiments, the input matching network inductor 333 may be an inductor, a transmission line, or a plurality or combination of inductors and/or transmission lines.

It will be appreciated that, in the example of a differential amplifier having first and second amplifier input terminals, an input matching network 230, 330 may be provided for each amplifier input terminal. In some examples, as shown in FIG. 2, a first and second input matching network 230 may comprise common components, such as a common input matching network capacitor and a common input matching network reference node.

The temperature dependent variable impedance unit may be suitable for providing temperature compensation for an amplifier configured to receive an AC signal of substantially any frequency. The skilled person understands how to scale the components of the temperature dependent variable impedance unit, based on the present disclosure, to achieve the desired temperature compensation for the desired frequency of operation. The disclosed amplifier circuit 200, 300 may be particularly beneficial for mm-wave applications and, further, the amplifier circuit 200, 300 of FIGS. 2 and 3 having a differential cascode amplifier may be particularly beneficial when operating in such regimes. As such, the components of the amplifier 212, 312 may be configured to process signals between 60-110 GHz. The components of the temperature dependent variable impedance unit 201, 301 may be configured to provide suitable operation in supporting the amplifier 212, 312 when receiving signals between 60-110 GHz. The components may particularly be configured to receive and process signals between 75-85 GHz or more particularly at 77 GHz. It will be appreciated by a person skilled in the art that configuring the various components of the amplifier circuit 200, 300 to operate within certain frequency regimes may involve scaling the magnitudes of said components to suitable sizes, inductances, capacitances, resistances and other electrical characteristics to operate within the desired regime. It will be appreciated by a skilled person that just because components of another circuit may be connected in similar arrangements, if they are configured for operation of different technical uses, then they may not necessarily provide for the same technical effect as the circuits disclosed herein, The amplifier circuit 200, 300 disclosed herein may be used for amplifiers 212, 312 which do not operate within the mm-wave regime, but the configuration of the components to provide for temperature compensation of the temperature dependence of an amplifier 212, 312 together provides for the desired technical effect.

Figure 4:
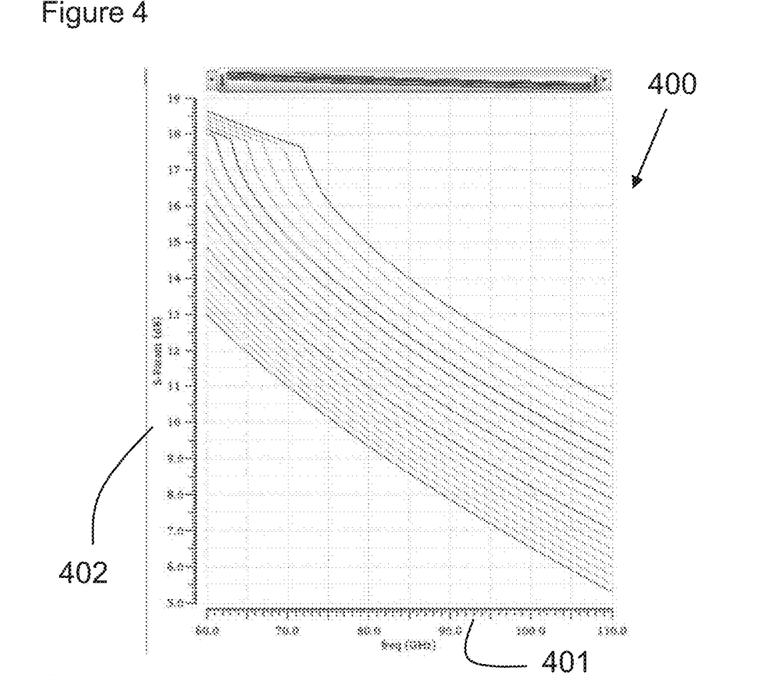
FIG. 4 shows simulated results of frequency vs maximum gain calculated from S-parameters at a range of temperatures for an amplifier absent of a temperature dependent impedance unit according to the present disclosure.
Figure 5:
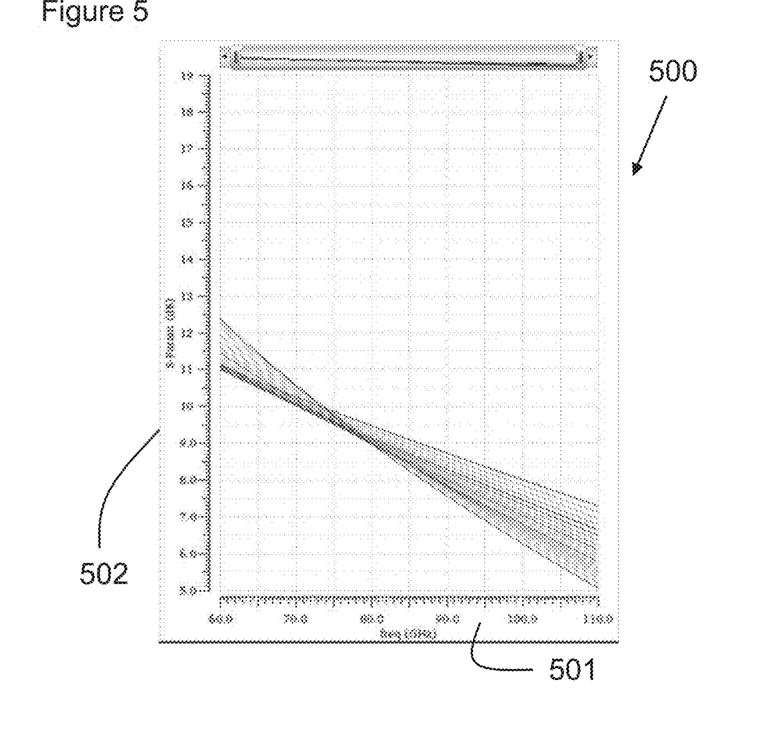
FIG. 5 shows simulated results of frequency vs maximum gain calculated from S-parameters at a range of temperatures for an amplifier comprising a temperature dependent impedance unit according to the present disclosure.

FIGS. 4 and 5 show simulated results 400, 500 based on a differential cascade amplifier of FIG. 3 when operated between 60 GHz and 110 GHz along the x-axis, 401, 501 with a CMOS process. Each of the lines represents an isotherm separated by 10 degrees Celsius increments from −40 degrees Celsius to +140 degrees Celsius. The y-axis 402, 502 shows the maximum gain variation measured in decibels (dB). FIG. 4 shows results 400 without temperature compensation provided by the temperature dependent variable impedance unit of the present disclosure. FIG. 5 shows the results 500 with temperature compensation provided by the temperature dependent variable impedance unit of the present disclosure. It can be seen from the simulated results that the gain variation is reduced from 6 dB to 1 dB at around an 80 GHz operating frequency. Thus, the advantages of the presently disclosed amplifier circuit are shown.

The amplifier circuit of the present disclosure may be particularly beneficial in automotive radar transceiver devices where a plurality of amplifiers may be implemented to provide for the functionality of the automotive radar transceiver device and the automotive vehicle may be liable to operating in several different temperature regimes over the course of a single journey or its lifetime.

Figure 6:
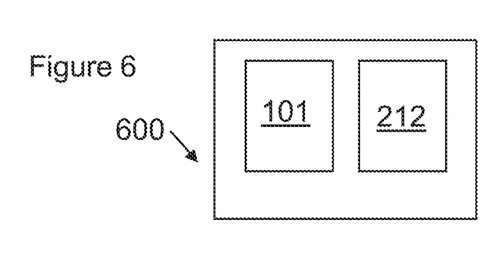
FIG. 6 shows an automotive radar transceiver.

Example FIG. 6 shows an automotive radar transceiver 600 comprising the amplifier 212 and the temperature dependent variable impedance unit 101 coupled thereto.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. An amplifier circuit comprising:
an amplifier having an amplifier input terminal and an amplifier output terminal;
a temperature dependent variable impedance unit comprising:
a first terminal, a second terminal and a variable impedance unit control terminal;
a transistor comprising a conduction channel and a transistor control terminal, wherein the transistor control terminal is coupled to the variable impedance unit control terminal;
a first resistor, wherein the first resistor is coupled in parallel with the conduction channel of the transistor;
a capacitor coupled in series with the conduction channel of the transistor between the conduction channel and one of: (i) the first terminal; and (ii) the second terminal; and
wherein:
the first terminal is coupled to one of: (a) the amplifier input terminal and (b) the amplifier output terminal;
the second terminal is for coupling to a reference node;
the variable impedance unit control terminal is configured to receive a control signal that is based on a measured temperature indicative of a temperature of the amplifier circuit and thereby provide a temperature dependent variable impedance for the amplifier circuit; and
a control signal supply unit, wherein the control signal supply unit is configured to:
measure the temperature indicative of a current temperature of the amplifier circuit; and
provide the control signal based on the measured temperature to the variable impedance unit control terminal;
wherein the control signal supply unit includes registers for storing values to calibrate the control signal supply unit to provide fine-tuning of the temperature dependence based on one or more temperature measurements.

2. An amplifier circuit comprising:
an amplifier having an amplifier input terminal and an amplifier output terminal;
a temperature dependent variable impedance unit comprising:
a first terminal, a second terminal and a variable impedance unit control terminal;
a transistor comprising a conduction channel and a transistor control terminal, wherein the transistor control terminal is coupled to the variable impedance unit control terminal;
a first resistor, wherein the first resistor is coupled in parallel with the conduction channel of the transistor;
a second resistor, wherein the control terminal of the transistor is coupled to the variable impedance unit control terminal via the second resistor, and wherein the second resistor is configured to reduce the impact of parasitic capacitances from the control signal supply unit on the gate of the transistor;

a capacitor coupled in series with the conduction channel of the transistor between the conduction channel and one of: (i) the first terminal; and (ii) the second terminal; and wherein:

the first terminal is coupled to one of: (a) the amplifier input terminal and (b) the amplifier output terminal;

the second terminal is for coupling to a reference node;

the variable impedance unit control terminal is configured to receive a control signal that is based on a measured temperature indicative of a temperature of the amplifier circuit and thereby provide a temperature dependent variable impedance for the amplifier circuit.

3. The amplifier circuit of claim 1 wherein the control signal supply unit comprises a temperature-controlled voltage source.

4. The amplifier circuit of claim 1 wherein the control signal supply unit comprises a temperature sensor configured to measure the temperature by being configured to determine one of:

i) the temperature of the amplifier circuit;

ii) the temperature of an integrated circuit substrate on which the amplifier circuit is formed; and iii) the temperature of a structure, wherein the structure is responsive to ambient temperature at a rate within a threshold of the rate at which the amplifier circuit is responsive to ambient temperature.

5. The amplifier circuit of claim 2 wherein the control terminal is configured to receive the control signal from a control signal supply unit that is arranged remote from the amplifier circuit but configured to be responsive to ambient temperature at a rate within a threshold of the rate at which the amplifier circuit is responsive to ambient temperature.

6. The amplifier circuit of claim 1 wherein the control signal is linearly dependent on the measured temperature.

7. The amplifier circuit of claim 1 wherein the control signal is non-linearly dependent on the measured temperature.

8. The amplifier circuit of claim 1 wherein the control terminal is configured to receive the control signal from a control signal supply unit that is arranged remote from the amplifier circuit but configured to be responsive to ambient temperature at a rate within a threshold of the rate at which the amplifier circuit is responsive to ambient temperature.

9. The amplifier circuit of claim 1 further comprising a second resistor, wherein the control terminal of the transistor is coupled to the variable impedance unit control terminal via the second resistor, and wherein the second resistor is configured to reduce the impact of parasitic capacitances from the control signal supply unit on the gate of the transistor.

10. The amplifier circuit of claim 1 wherein, when the temperature compensation arrangement is coupled to the amplifier output terminal, the capacitor is coupled between the first terminal and the conduction channel of the transistor.

11. The amplifier circuit of claim 1 wherein the transistor comprises a MOSFET.

12. The amplifier circuit of claim 1 wherein the amplifier comprises a differential cascode amplifier wherein the differential cascode amplifier comprises:

a first branch having a first end couplable to a first cascode reference node and a second end couplable to both a second cascode reference node, via an output matching network capacitor, and a cascode voltage source, the first branch further comprising:

a first cascode transistor having a conduction channel and a control terminal, the conduction channel of the first cascode transistor couplable at a first terminal to the first cascode reference node;

a second cascode transistor having a conduction channel and a control terminal, the conduction channel of the second cascode transistor coupled at a first terminal in series with a second terminal of the conduction channel of the first cascode transistor; and a first output matching network portion, the first output matching network portion coupled at a first terminal to a second terminal of the conduction channel of the second cascode transistor and a second terminal of the first output matching network portion couplable to the second reference node;

a second branch having a first end couplable to the first cascode reference node and a second end couplable to the second cascode reference node, the second branch further comprising:

a third cascode transistor having a conduction channel and a control terminal, the conduction channel of the third cascode transistor couplable at a first terminal in series with the first cascode reference node;

a fourth cascode transistor having a conduction channel and a control terminal, the conduction channel of the fourth cascode transistor coupled at a first terminal in series with a second terminal of the conduction channel of the third cascode transistor; and a second output matching network portion, the second output matching network portion coupled at a first terminal to a second terminal of the conduction channel of the fourth cascode transistor and a second terminal of the second output matching network portion couplable to the second reference node, wherein the control terminals of the second and fourth cascode transistors are coupled together, wherein the control terminals of the first cascode transistor and the control terminal of the third cascode transistor is coupled to the amplifier input terminal, and wherein one of the first and second output matching network portions is coupled to the amplifier output terminal.

13. The amplifier circuit of claim 12 wherein the first terminal of the temperature dependent variable impedance unit is coupled to an input matching network comprising:

an input matching network capacitor couplable at a first terminal to the voltage source;

an input matching network reference node couplable to a second terminal of the input matching network capacitor; and an input matching network inductance element coupled at a first terminal to the first terminal of the input matching network capacitor and a second terminal of the input matching network inductance element coupled to the amplifier input terminal.

14. The amplifier circuit of claim 13 wherein the inductance element comprises an inductor, a transmission line or a combination thereof.

15. An automotive radar transceiver comprising an amplifier circuit, the amplifier circuit comprising:

an amplifier having an amplifier input terminal and an amplifier output terminal, wherein the amplifier circuit further comprises a control signal supply unit, wherein the control signal supply unit is configured to:

measure the temperature indicative of a current temperature of the amplifier circuit; and provide the control signal based on the measured temperature to the variable impedance unit control terminal;

a temperature dependent variable impedance unit comprising:
- a first terminal, a second terminal and a variable impedance unit control terminal;
- a transistor comprising a conduction channel and a transistor control terminal, wherein the transistor control terminal is coupled to the variable impedance unit control terminal;
- a first resistor, wherein the first resistor is coupled in parallel with the conduction channel of the transistor;
- a capacitor coupled in series with the conduction channel of the transistor between the conduction channel and one of: (i) the first terminal; and (ii) the second terminal; and wherein:
the first terminal is coupled to one of: (a) the amplifier input terminal and (b) the amplifier output terminal;
the second terminal is for coupling to a reference node;
the variable impedance unit control terminal is configured to receive a control signal that is based on a measured temperature indicative of a temperature of the amplifier circuit and thereby provide a temperature dependent variable impedance for the amplifier circuit; and
the control signal supply unit includes registers for storing values to calibrate the control signal supply unit to provide fine-tuning of the temperature dependence based on one or more temperature measurements.

16. The amplifier circuit of claim 2 further comprising a second resistor, wherein the control terminal of the transistor is coupled to the variable impedance unit control terminal via the second resistor, and wherein the second resistor is configured to reduce the impact of parasitic capacitances from the control signal supply unit on the gate of the transistor.

17. The automotive radar transceiver of claim 15, wherein the control signal supply unit comprises a temperature-controlled voltage source.

18. The amplifier circuit of claim 2 wherein, when the temperature compensation arrangement is coupled to the amplifier output terminal, the capacitor is coupled between the first terminal and the conduction channel of the transistor.

19. The automotive radar transceiver of claim 15, wherein the control signal is linearly dependent on the measured temperature.

20. The automotive radar transceiver of claim 15, wherein the variable impedance unit control terminal is configured to receive the control signal from a control signal supply unit that is arranged remote from the amplifier circuit but configured to be responsive to ambient temperature at a rate within a threshold of the rate at which the amplifier circuit is responsive to ambient temperature.

* * * * *